United States Patent [19]

Boll et al.

[11] 4,275,313
[45] Jun. 23, 1981

[54] CURRENT LIMITING OUTPUT CIRCUIT WITH OUTPUT FEEDBACK

[75] Inventors: Harry J. Boll, Berkeley Heights; Richard M. Goldstein, Summit, both of N.J.

[73] Assignee: Bell Telephone Laboratories, Incorporated, Murray Hill, N.J.

[21] Appl. No.: 28,115

[22] Filed: Apr. 9, 1979

[51] Int. Cl.³ ................ H03K 19/003; H03K 19/094; H03K 17/14; H03K 19/20

[52] U.S. Cl. ................... 307/448; 307/270; 307/475; 307/562; 307/238.1

[58] Field of Search ............... 307/205, 214, 237, 251, 307/270, DIG. 1, DIG. 4

[56] References Cited

U.S. PATENT DOCUMENTS

| 3,651,340 | 3/1972 | Cliff | 307/251 |
|---|---|---|---|
| 3,906,255 | 9/1975 | Mensch, Jr. | 307/205 |
| 3,913,026 | 10/1975 | Koehler | 307/205 X |
| 4,016,434 | 4/1977 | De Filippi | 307/205 X |
| 4,048,518 | 9/1977 | Koo | 307/205 X |
| 4,065,678 | 12/1977 | Reese et al. | 307/205 X |
| 4,096,398 | 6/1978 | Khaitan | 307/270 X |
| 4,101,788 | 7/1978 | Baker | 307/270 X |

OTHER PUBLICATIONS

Hoffman, "On-Chip Signal Level Detector"; *IBM Tech. Discl. Bull.;* vol. 20, No. 9, pp. 3632–3633; 2/1978.

*Primary Examiner*—Larry N. Anagnos
*Attorney, Agent, or Firm*—Arthur J. Torsiglieri

[57] ABSTRACT

An IGFET push-pull driver circuit includes an output stage having pull-up and pull-down IGFETs for driving an output node. An inverter stage drives the gate of the pull-up IGFET. A current sensing IGFET biased to represent a resistance is coupled between the pull-up IGFET and the output node to provide a voltage drop which is proportional to the current flowing through the pull-up IGFET. A regulating IGFET with its channel coupled between the gate of the pull-up IGFET and the output node and with its gate coupled to the juncture of the pull-up IGFET and the current sensing IGFET, responds to the voltage drop across the current sensing IGFET to provide feedback control of the conductance of the pull-up IGFET. The maximum output current of the driver is limited to a value which remains substantially constant over a wide range of processing parameters, operating temperature and load impedance.

5 Claims, 5 Drawing Figures

CURRENT LIMITING OUTPUT CIRCUIT WITH OUTPUT FEEDBACK

BACKGROUND OF THE INVENTION

This invention relates to insulated gate field effect transistor (IGFET) push-pull driver circuits and, more particularly, to an IGFET push-pull driver circuit in which the output current is accurately controlled by a current sensing feedback arrangement.

IGFET push-pull drivers are known in the art and are typically included in digital integrated circuits implemented in N-channel metal-oxide-semiconductor (NMOS), P-channel metal-oxide-semiconductor (PMOS), and complementary metal-oxide-semiconductor (CMOS) technologies. Such circuits are characterized by having a pull-up transistor connected between an output node and a VDD supply terminal and a pull-down transistor connected between the output node and a VSS supply terminal. Push-pull drivers are useful as output drivers particularly where the load to be driven is highly capacitive. The push-pull configuration allows high transconductance transistors to be used for rapid charging and discharging of the load without creating a power-consuming dc current path between the VDD and VSS power supplies. The push-pull configuration also permits operation in the so-called tri-state mode where a "third", high impedance, state can be provided at the output node by causing both the pull-up and pull-down transistors to be in their nonconducting state.

In many applications it is necessary to control the current output of a driver. One such application is where the IGFET driver circuit provides the input signal to an emitter coupled logic (ECL) gate. In order to avoid driving the input transistor of the ECL gate into saturation, the current from the output driver must be limited to some maximum value. Another application in which the output current from the IGFET driver must be limited is where several drivers provide the inputs for a current weighting network such as those found in the input stage of a digital-to-analog converter. Here, not only must the output current of each driver be limited, but the output current of each driver must be made substantially equal. However, the output current of a conventional IGFET push-pull driver is subject to large variations caused by normal processing variations of certain transistor parameters such as the threshold voltage (VT), and by variations in the device operating temperature. Therefore, conventional IGFET push-pull drivers are not suitable for many applications where the maximum output current must be accurately controlled.

One prior art technique for limiting the output current of an IGFET push-pull driver is to use a current limiting resistor between the VDD power supply terminal and the pull-up transistor. Circuit configurations using this technique have been disclosed in U.S. Pat. Nos. 3,651,340 and 3,906,255. However, such circuits have a shortcoming in that the output current, although limited by the resistor, is still dependent on the value of the current limiting resistor. Accurate control of the output current in such driver configurations would require the use of precise value resistors which would significantly increase the manufacturing cost of circuits in which they are used.

Another prior art technique for limiting the output current in an IGFET driver is to provide feedback control of the output voltage. Circuit configurations employing this technique have been disclosed in U.S. Pat. Nos. 4,065,678 and 4,096,398. Although the feedback technique would provide accurate control of the output voltage, the output current would, nevertheless, vary with variations in load impedance. Therefore, this technique is also deficient for applications where the input impedance of load circuits are subject to variations. Therefore, a need exists for an IGFET driver circuit which provides the advantages of a push-pull configuration while also providing accurate control of the maximum output current, notwithstanding variations in transistor parameters, operating temperature, and load impedance.

SUMMARY OF THE INVENTION

The present invention provides a current limiting IGFET push-pull driver circuit having a first IGFET coupled between a first voltage conductor and an output node, a second IGFET coupled between a second voltage conductor and a control node, characterized in that there is included current sensing means coupled between the control node and the output node for producing a sensing voltage proportional to the current flowing between the second voltage conductor and the output node, and regulating means coupled to the gate of the second IGFET responsive to the sensing voltage for altering the conductance of the second IGFET.

Accordingly, it is an object of the present invention to provide an IGFET push-pull driver circuit in which the maximum output current is controlled to an accurate value over a wide range of transistor parameters, operating temperature, power supply voltage and load impedance.

It is a further object of the present invention to provide an IGFET driver circuit in which the output current is regulated by a current sensing feedback arrangement.

The above and other objects of the invention are achieved in a preferred embodiment described hereinafter. The novel features of the invention, both as to structure and method of operation, together with further objects and advantages thereof will be better understood from the following description considered in connection with the accompanying drawing. It is to be expressly understood, however, that the drawing is solely for the purpose of illustration and description and is not intended to define limits of the invention.

DETAILED DESCRIPTION

Figure 1:
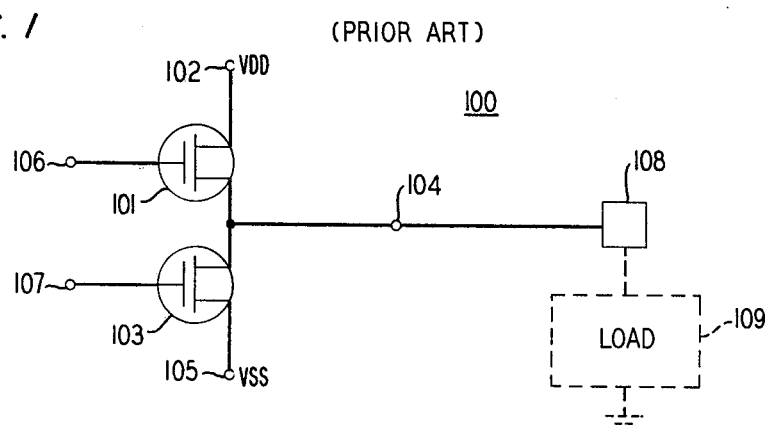
FIG. 1 is a schematic diagram of a conventional IGFET push-pull output driver circuit.

Referring now to FIG. 1, there is shown a schematic diagram of a conventional push-pull driver circuit 100 commonly used as the output stage in MOS integrated circuits. The driver has a pull-up IGFET 101 having its drain electrode connected to a VDD power supply terminal 102 and its source electrode connected to the output node 104, and a pull-down IGFET 103 having its source electrode connected to a VSS power supply terminal 105 and its drain electrode connected to the output terminal 104. The load 109 is connected to the output node via the bonding pad 108.

The circuit of FIG. 1 may be implemented in NMOS, PMOS, or CMOS. In the case of NMOS, the VDD supply is positive with respect to VSS. Thus when a positive voltage representative of a "high" logic level (VDD-VT or greater) is applied to the gate 106 of the pull-up transistor and a voltage representative of the "low" logic level (substantially VSS) is applied to the gate 107 of the pull-down transistor, the pull-up transistor becomes conducting while the pull-down transistor becomes nonconducting. Under these conditions, the output node goes to a "high" logic level threshold. Conversely, when a voltage representative of the "low" logic level is applied to the gate of the pull-up transistor and a voltage representative of the "high" logic level is applied to the gate of the pull-down transistor, the pull-down transistor becomes conducting while the pull-up transistor becomes nonconducting, and the output node goes to a "low" logic level. If, however, a voltage representative of a "low" logic level is applied to the gates of both the pull-up and pull-down transistors, both transistors become nonconducting, and the output node becomes effectively isolated from the VDD and VSS terminals. Under these conditions, the output is said to be in the "third" state of the tri-state mode of operation.

It may be noted that with the push-pull circuit configuration it is possible to avoid the condition where both the pull-up and pull-down transistors are conducting at the same time to provide a low resistance direct current path between the VDD and VSS power supplies. Therefore, both the pull-up and pull-down transistors may be designed to have large transconductances for the purpose of achieving fast switching speed without the penalty of excessive power dissipation from dc conduction within the circuit. Moreover, since only one of the two transistors is conducting at a given time, there does not exist the problem of one transistor "pulling" against the other as in an ordinary IGFET inverter circuit. Therefore, it is not necessary to "ratio" the transconductances of the two transistors to insure an adequate "low" logic level for the circuit.

In the case where the push-pull driver circuit is implemented in PMOS, the principles of operation remain the same as for the NMOS case except the VDD power supply voltage is negative with respect to VSS as is the "high" logic level.

In the case of a CMOS implementation where the pull-up transistor is a P-channel device while the pull-down transistor is an N-channel device, the VDD supply voltage and the "high" logic level are both positive with respect to VSS as in the NMOS case. However, to obtain a "high" logic level at the output node, a "low" logic level must be applied to the gates of both the pull-up and the pull-down transistors, while to obtain a "low" logic level at the output node, a "high" logic level must be applied to the gates of both transistors. The "third" logic state may be obtained at the output node by applying a "low" logic level to the gate of the pull-down (N-channel) transistor and a "high" logic level to the gate of the pull-up (P-channel) transistor.

The steady-state current provided to the load when the output is in the "high" logic state is that which flows through the electrical path between the VDD supply terminal and the output node. The magnitude of this output current is determined at a large degree by the magnitude of the VDD supply voltage, the gate voltage ("high" logic level) of the pull-up transistor, the transistor parameters of the pull-up transistor, the operating temperature, and the resistance of the load. Normally, the supply voltages and the logic levels in the circuit are not subject to large variations. However, the transistor parameters will vary with variations in processing and operating temperature. The load resistance, if the load is another logic circuit, will vary with variations in the input impedance of such load circuits. The transistor parameters affecting output current are the width to length ratio of the channel, the gate capacitance, the surface mobility of channel carriers, and the threshold voltage. The latter two parameters will also vary with the operating temperature of the IGFET. In a typical NMOS implementation of the push-pull circuit, normal manufacturing process variations and temperature variations may cause the output current to vary by as much as 40 percent.

Figure 2:
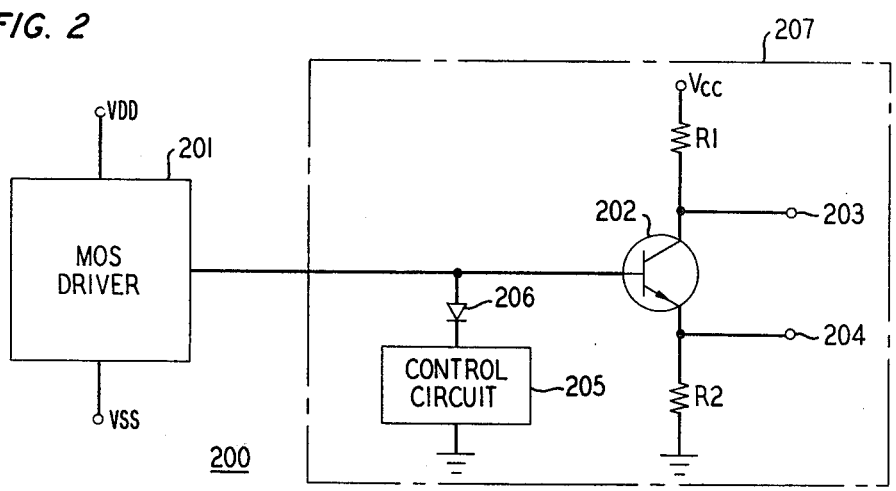
FIG. 2 is a schematic diagram of a load circuit which requires a current limited signal source.

Some types of load circuits, when driven by the conventional push-pull circuit, are not able to tolerate such a large variation in driving current. For example, where the load circuit is an ECL gate, saturation of the input transistor must be avoided to preserve the fast switching speeds which are characteristic of ECL gates. Another example is where a bipolar load circuit includes a control circuit for regulating the base drive current to an input transistor. Such a load circuit is shown schematically in FIG. 2. Referring now to FIG. 2, an MOS driver circuit 201 supplies a base current to an input transistor 202 of a load circuit 207. The base current must be sufficient to ensure that an output voltage taken at node 203 or 204 reaches a specified value. The control circuit 205 is used to disable the input transistor by diverting the drive current from the MOS driver through a diode, 206. The presence of the control circuit causes the input resistance of the load circuit to be highly nonlinear. When the control circuit is inactive, the input resistance of the load circuit is on the order of several kilohms. However, when the control circuit is active, the input resistance of the load circuit typically falls to less than 100 ohms. Therefore, to avoid overdriving the control circuit, the output current of the MOS driver must be limited.

Figure 3:
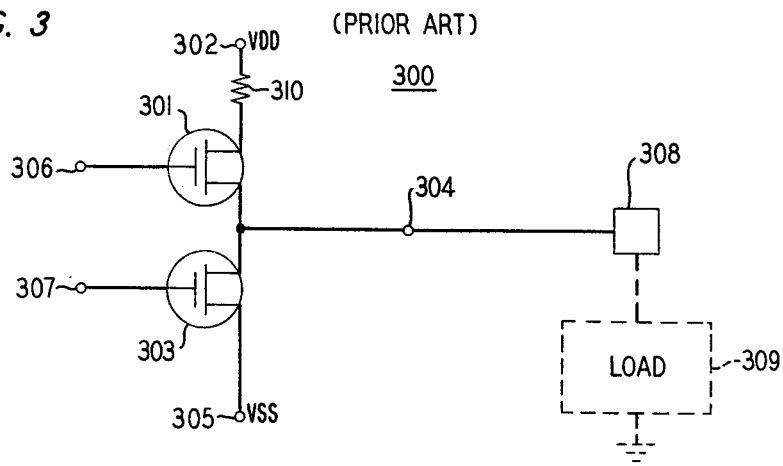
FIG. 3 is a schematic diagram of a prior art IGFET push-pull driver including a current limiting resistor.

Referring now to FIG. 3, there is shown a schematic diagram of a prior art push-pull circuit 300 having a high valued resistor 310 between the VDD supply terminal 302 and the pull-up transistor 301. The resistor serves to limit the current supplied at the output terminal 304 by increasing the resistance along the electrical path between the VDD supply terminal and the output node. The output current of the circuit of FIG. 3 will be largely determined by the value of the current limiting resistor, if the value is considerably greater than the channel resistance of the pull-up transistor while in its conducting state ("on" resistance) and the resistance of the load 309. Thus, to obtain accurate limiting of the output current, a precision value resistor must be used. However, high valued precision resistors are not readily available in standard MOS technologies. Therefore, the current limiting push-pull circuit of FIG. 3 has the disadvantage of generally requiring special processing steps for fabricating precision high valued resistors which would add considerably to the manufacturing cost of an integrated circuit. Moreover, the addition of a high valued resistance in series with the pull-up transistor has an adverse effect on the switching speed of the push-pull circuit.

Figure 4:
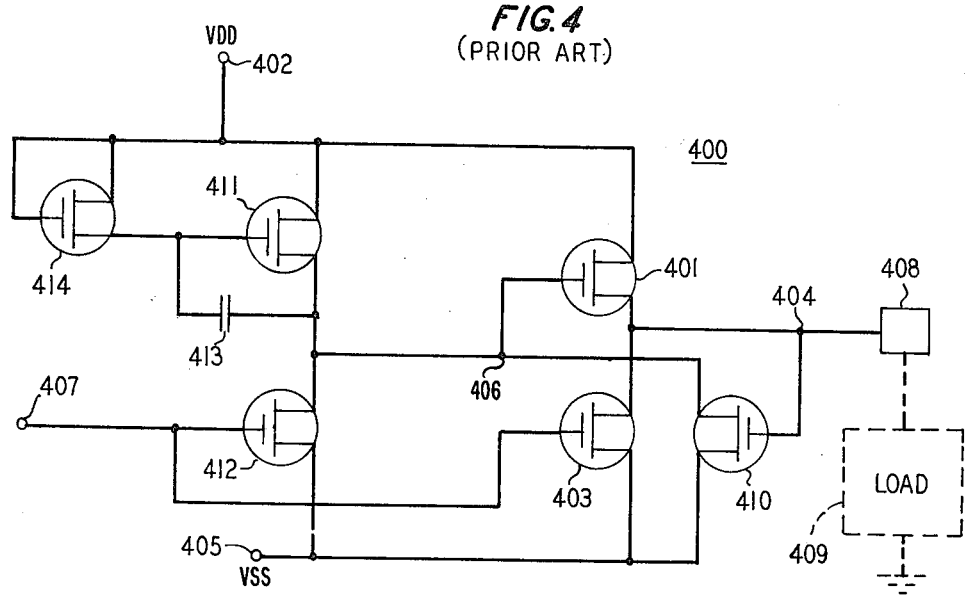
FIG. 4 is a schematic diagram of another prior art IGFET output driver employing feedback control of the output voltage.

Another prior art technique which can be used to limit the output current of a push-pull driver is shown in FIG. 4. The circuit shown provides for feedback control of its output voltage and effective control of its output current if the load resistance at its output terminal remains constant. Referring now to FIG. 4, the driver circuit 400 includes an output stage having a pull-up transistor 401 and a pull-down transistor 403 both driving a common output node 404. The output node is connected to a load 409 via a bonding pad 408. The gate of the pull-down transistor receives an input signal directly from the main input terminal 407. The gate of the pull-up transistor receives the complement of the input signal from node 406 which serves as the output from a bootstrapped inverter stage consisting of transistors 411, 412, and 414 and a capacitor 413. The operation of the bootstrapped inverter is well known to those skilled in the art of IGFET circuits and, therefore, need not be explained except to say that it provides the inverse or complement of the input signal at node 406 and "boosts" the "high" logic level of that signal to VDD or greater. The output stage of the driver includes a voltage regulating transistor 410 whose gate is connected to the output node 404 and whose channel is connected between the gate of the pull-up transistor and VSS. The regulator transistor provides feedback control of the "high" logic voltage level at the output node. For example, if a "low" logic level signal were applied to the input 407, the gate of the pull-up transistor 401 would go to a "high" logic level while the gate of the pull-down transistor 403 would go to a "low" logic level. Consequently, the pull-down transistor becomes nonconducting while the pull-up transistor becomes conducting causing the output voltage at node 404 to rise towards a "high" logic level. When the voltage at node 404 exceeds VT, the regulating transistor begins to conduct, creating a current path between the gate of the pull-up transistor and VSS. Once the output voltage becomes sufficiently high to cause the conductance of the regulating transistor to become significant in comparison to the conductance of transistor 411, the voltage on the gate of the pull-up transistor will begin to fall. Lowering the gate voltage of the pull-up transistor causes its conductance to decrease and prevents further rise in the output voltage. The final value of the output voltage is determined largely by the ratio of the tranconductances of transistors 410 and 411.

To the extent that the output voltage in the circuit of FIG. 4 is limited, the output current provided to the load 409 is limited if the load resistance remains constant. However, if the load resistance varies, the output current will also vary and remain in inverse proportion to the load resistance.

Figure 5:
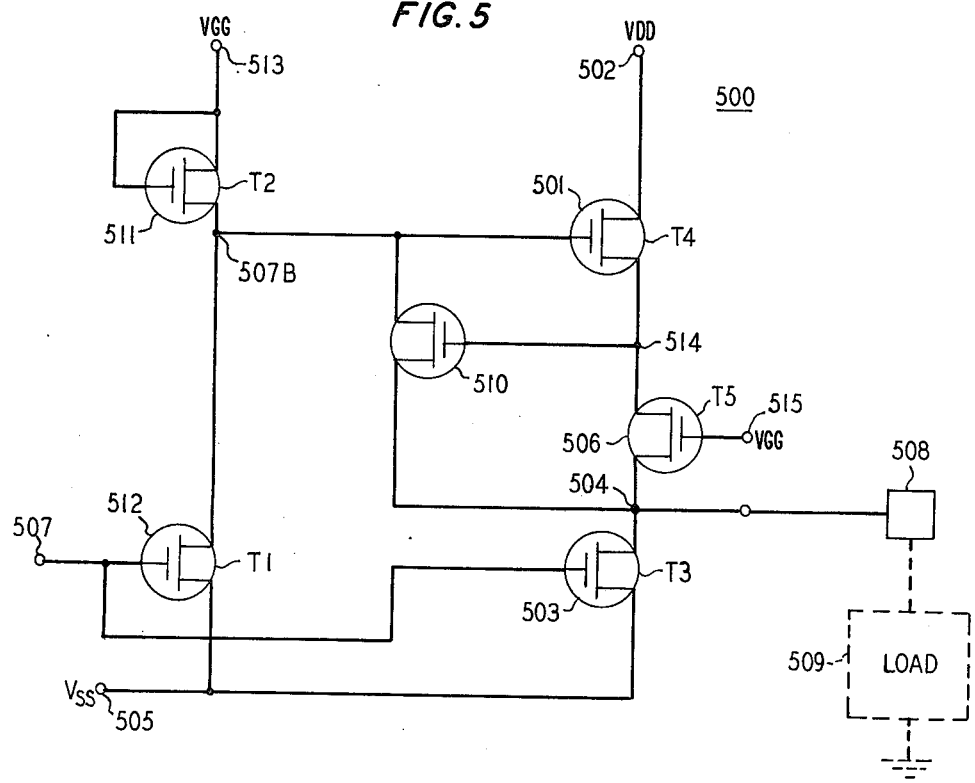
FIG. 5 is a schematic diagram of an IGFET output driver in accordance with the preferred embodiment of the present invention.

Referring now to FIG. 5, there is shown a preferred embodiment of the present invention. A driver circuit includes an output stage having a pull-up transistor 501 having its channel coupled between a VDD supply terminal 502 and a control node 514, and a pull-down transistor 503 having its channel coupled between a VSS supply terminal 505 and the output node 504. The gate of the pull-up transistor is driven by the output of an inverter stage at terminal 507B which is complementary to the main input terminal 507. The inverter stage consists of transistors 511 and 512 which are connected between a VGG supply terminal 513 and the VSS supply terminal 505. In the preferred embodiment, the VGG supply provides a bias voltage which exceeds VDD+2VT to insure that the "high" logic level at node 507B exceeds VDD+VT and that the "high" logic level at the output node 504 is substantially equal to VDD. The inverter stage is driven by an input signal applied at the input terminal 507. The input signal is also applied to the gate of the pull-down transistor. A current sensing transistor 506 coupled between the pull-up transistor and the output node is used as a resistance to provide a voltage drop across its channel which is proportional to the current flowing to the output node. The gate 515 of the current sensing transistor is biased at some appropriate voltage to obtain a desired "on" resistance. In the preferred embodiment, to keep the current sensing transistor in the active region of its operating characteristics, node 515 is biased at the VGG supply voltage. Although in the preferred embodiment an IGFET is used as the current sensing means, other equivalent means such as a voltage dropping resistor may be substituted by one skilled in the art. A regulating transistor 510, having its gate connected to control node 514, its source connected to the output node, and its drain connected to the gate of the pull-up transistor, responds to the voltage drop across the channel of the current sensing transistor. When a "low" logic level signal is applied to the input terminal, the pull-down transistor 503, which receives its gate voltage directly from the input terminal, becomes nonconducting while the pull-up transistor 501, which receives its gate voltage from the inverter stage, becomes conducting. Current begins to flow from the VDD supply terminal through the pull-up transistor and the current sensing transistor to the output node causing a voltage drop across the current sensing transistor. When the voltage drop exceeds VT, the regulating transistor begins to conduct creating a current path between the gate of the pull-up transistor and the output node. When the voltage drop becomes sufficient to cause the conductance of the regulating transistor to be significant in comparison to the conductance of transistor 511, the gate voltage of the pull-up transistor is lowered. Thus the conductance of the pull-up transistor is reduced and the output current is prevented from rising any further.

The preferred embodiment was designed according to the following specification: supply voltages of VDD−VSS=5 V±0.5 V and, VGG−VSS=12 V±0.6 V; a temperature range of 0 degrees C. to 110 degrees C.; a maximum "low" logic level output voltage of 0.8 V; a maximum "high" logic level output current 2.5 mA when the output voltage is clamped at 2.1 V; and a minimum "high" logic level output current of 0.5 mA when the output is clamped at 2.1 V. The NMOS technology used to fabricate the preferred embodiment is characterized by a transistor threshold voltage of 1.2 V±0.4 V and a substrate doping concentration of $2 \times 10^{15}$ cm$^{-3}$±25%. The transconductances ($\beta$s) of the various transistors used in the preferred embodiment are listed in Table I.

TABLE I

| Transistor | Nominal Transconductance |
| --- | --- |
| T1 | $6\beta_D$ |
| T2 | $3\beta_L$ |
| T3 | $6\beta_D$ |
| T4 | $4.75\beta_D$ |

TABLE I-continued

| Transistor | Nominal Transconductance |
|---|---|
| T5 | $2\beta_D$ | where $\beta_D = 188 \times 10^{-6}$ A/V² and $\beta_L = 7.4 \times 10^{-6}$ A/V². The above transconductance ratios were chosen to minimize variations of the output current caused by variations in the device parameters. Both $\beta_D$ and $\beta_L$ are subject to variations of ±30% owing to variations in processing parameters and operating temperature.

Although the preferred embodiment is implemented in NMOS technology, circuits embodying the instant invention may also be implemented in PMOS technology or CMOS technology by one skilled in the art of IGFET switching circuit design.

We claim:

1. A current limiting push-pull driver circuit comprising:
   a first IGFET having its channel coupled between a first voltage conductor and an output node, the gate of the first IGFET being coupled to first input signal means, a second IGFET having its channel coupled between a second voltage conductor and a control node, the gate of the second IGFET being coupled to second input signal means complementary to the first, characterized in that there are included current sensing means coupled between the control node and the output node for producing a sensing voltage proportional to the current flowing between the second voltage conductor and the output node, and
   regulating means coupled to the gate of the second IGFET responsive to the sensing voltage for altering the conductance of the second IGFET.

2. A driver circuit as recited in claim 1 wherein the second input signal means comprise an inverter circuit having a third IGFET having its channel coupled between the first voltage conductor and a second node, the gate of the third IGFET being coupled to the first input signal means, a fourth IGFET having its channel coupled between a third voltage conductor and the second node, and wherein the gate of the second IGFET is coupled to the second node.

3. A driver circuit as recited in claim 2 wherein the regulating means comprises a fifth IGFET having its channel coupled between the second node and the output node, the gate of the fifth IGFET being coupled to the control node.

4. A driver circuit as recited in claim 3 wherein the current sensing means comprises a resistor coupled between the control node and the output node.

5. A circuit as recited in claim 3 wherein the current sensing means comprises a sixth IGFET having its channel coupled between the control node and the output node, and where the maximum current flowing between the second voltage conductor and the output node is determined by a relationship among the transconductances of the second, third, fifth and sixth IGFETs.

* * * * *